(12) United States Patent
Kizer et al.

(10) Patent No.: US 7,246,274 B2
(45) Date of Patent: Jul. 17, 2007

(54) METHOD AND APPARATUS FOR ESTIMATING RANDOM JITTER (RJ) AND DETERMINISTIC JITTER (DJ) FROM BIT ERROR RATE (BER)

(75) Inventors: Jade M. Kizer, Mountain View, CA (US); Christopher J. Madden, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 489 days.

(21) Appl. No.: 10/939,028

(22) Filed: Sep. 10, 2004

(65) Prior Publication Data

US 2006/0059392 A1    Mar. 16, 2006

(51) Int. Cl.
*G06F 11/00*    (2006.01)
(52) U.S. Cl. .................................................. 714/704
(58) Field of Classification Search ................ 714/704
See application file for complete search history.

(56) References Cited

U.S. PATENT DOCUMENTS 5,623,497 A    4/1997   Shimawaki et al.
6,298,315 B1   10/2001  Li et al.

OTHER PUBLICATIONS

Cai et al., Jitter testing for multi-gigabit backplae SerDes techniques to decompose and combine various types of Jitter, 2002, IEEE ITC International Test Conference, p. 700-709.*
Li et al., A new method for jitter decomposition through its distribution tail fitting, 1999, IEEE, ITC International Test Conference, p. 788-794.*
Robert K. Morrow, Jr., Accurate CDMA BER calculations with low computational complexity, Nov. 1998, IEEE Trans. on Comm., vol. 46, No. 11, p. 1413-1417.*
Fibre Channel—Methodologies for Jitter Specification, Methodology for Jitter Specification Technical Report REV 10, Jun. 9, 1999, pp. 1-96.

* cited by examiner

*Primary Examiner*—Shelly Chase
(74) *Attorney, Agent, or Firm*—Vierra Magen Marcus & DeNiro LLP

(57) ABSTRACT

An apparatus and method provides prediction of BER for an interface between ICs, such as a processor and a memory device, without using special test equipment. A known data pattern or PRBS is transmitted to a receiver, which compares the received data values with expected data values to determine if a bit error has occurred in an embodiment of the present invention. A center of data eye and the edge of the data eye are sampled (over sampled) in order to determine if a bit error has occurred in an alternate embodiment of the present invention. A first counter is used to count the total number of bits sampled and the second counter is used to count the number of errors that occurred in the total number of bits sampled.

45 Claims, 11 Drawing Sheets

METHOD AND APPARATUS FOR ESTIMATING RANDOM JITTER (RJ) AND DETERMINISTIC JITTER (DJ) FROM BIT ERROR RATE (BER)

FIELD OF THE INVENTION

The present invention relates to predicting errors between integrated circuits ("IC").

BACKGROUND OF THE RELATED ART

Testing ICs, and in particular the interface between ICs is typically performed by specialized test equipment. The use of specialized test equipment increases manufacturing cost, complexity and time.

A test often performed on ICs or an apparatus including multiple ICs by specialized test equipment includes obtaining a bit error rate ("BER") for an IC or an interface between ICs.

Thus, it is desirable to provide a method and/or apparatus for predicting or estimating a BER for an IC or an interface between ICs without using specialized test equipment.

BRIEF DESCRIPTION OF THE DRAWING

The present invention is illustrated by way of example, and not by way of limitation, in the figures of the accompanying drawing like reference numerals refer to similar elements.

DETAILED DESCRIPTION

An apparatus and method provide an accurate prediction of the BER for data signals transferred between ICs without the use of specialized test equipment in embodiment of the present invention. DJ and RJ values, used for calculating a BER, are extracted by transferring a predetermined data pattern with a known adjustable timing offset of a sampling clock signal, counting the total number of bits transferred and errors in embodiments of the present invention. The total number of bits transferred and corresponding errors are then output to a processing device, such as a general purpose computer, that calculates a plurality of BERs corresponding to the plurality of offsets, transforms the plurality of BERs, forms a linear relationship between the transformed BERs and the plurality of offset and obtains the RJ and DJ values from the linear relationship in embodiments of the present invention. The RJ and DJ values then may be input into a Fibre Channel jitter model equation to accurately predict BER as a function of offset from a sampling clock signal.

Thus, embodiments of the present invention reduce testing and design cost and time. Further, In-situ system testing after final assembly, typical operational periodic calibration and remote fieldwork are performed with embodiments of the present invention.

Jitter is the slight movement of a signal in time or phase that can introduce errors and/or loss of synchronization in an embodiment of the present invention. Jitter includes the sum of two component values: a random jitter ("RJ") value and a deterministic jitter ("DJ") value in an embodiment of the present invention.

Random noise sources such as thermal noise provide a fundamental source of unavoidable errors and are usually accounted for in timing analysis as RJ. In an embodiment of the present invention, RJ has an unbounded Gaussian time distribution that is measured in terms of a probability such as a BER.

The other component of jitter is typically predictable and is usually accounted for in timing analysis as DJ.

Characterization of RJ and DJ jitter components is critical to predict the long-term bit error rate of an apparatus. Typically, this is done with specialized testing equipment that is expensive in both time and resources to ensure every apparatus is tested accurately. A number of benefits can be achieved by eliminating the specialized test equipment. First, specialized input/output circuits in devices required for specialized test equipment are eliminated that will decrease the overall expense of the apparatus. Second, ICs may be periodically tested after manufacturing without the specialized test equipment. Third, as ICs become more complex, such as 4 pulse amplitude modulation ("4PAM") or wavelength division multiplexing ("WDM") ICs, a testing procedure that simplifies the testing of complex ICs will reduce time to market and improve development efficiency.

Figure 1:
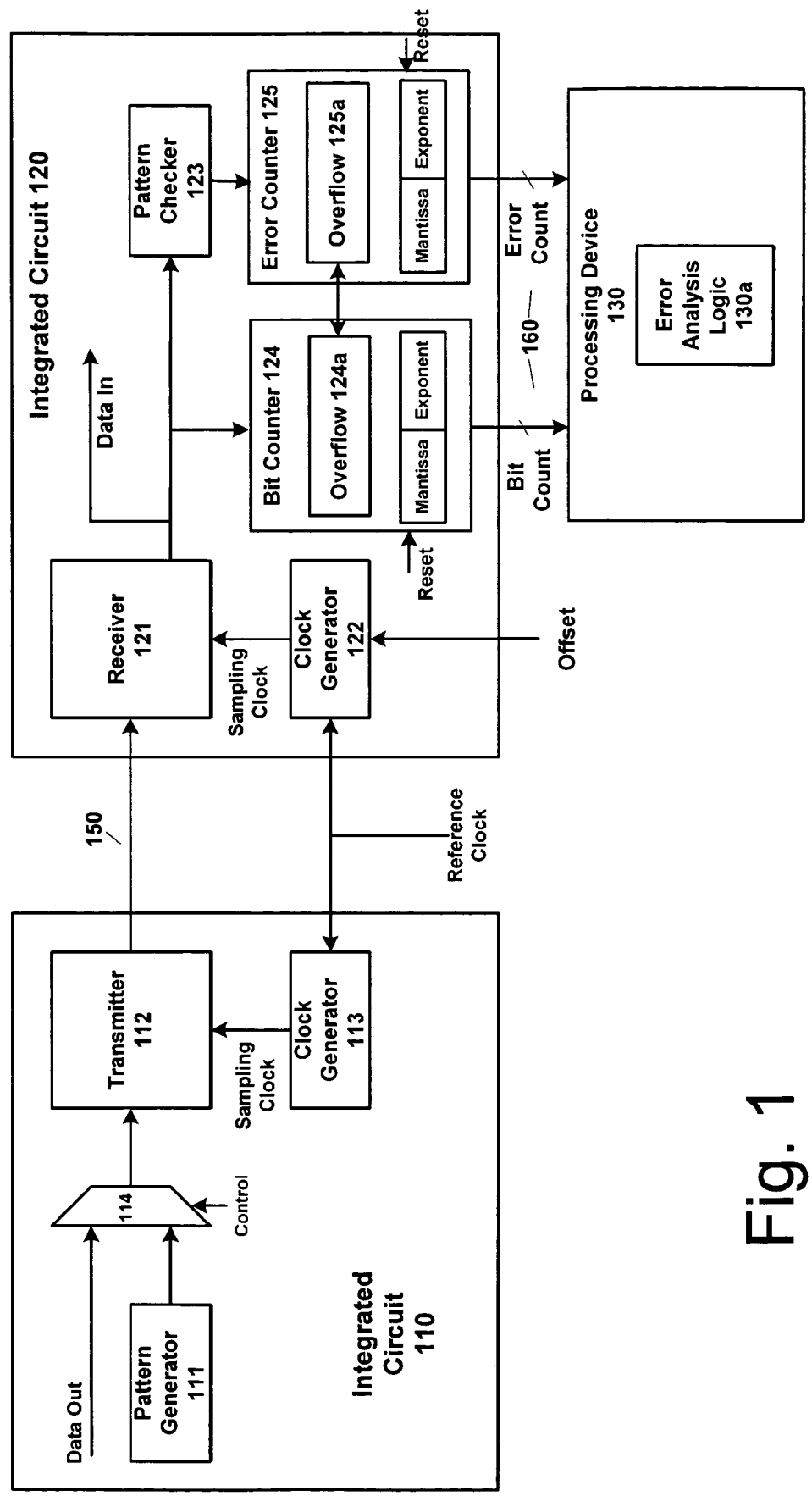
FIG. 1 illustrates an apparatus including offsetting a sampling clock signal in a receiver according to an embodiment of the present invention.

FIG. 1 illustrates an apparatus 100 including offsetting a sampling clock signal in a receiver according to an embodiment of the present invention. In an embodiment of the present invention, IC 110 is coupled to IC 120 by interconnect 150. IC 110 provides electrical signals on interconnect 150 to IC 120.

In an embodiment of the present invention, interconnect 150, and interconnects described herein, include a plurality or single trace, wire, conducting element, backplane link, combination thereof or an equivalent for conducing electrical signals in embodiments of the present invention. In embodiments of the present invention, interconnects described herein, transfer data, command (including read and/or write commands) and/or control signals. In embodiments of the present invention, interconnects are unidirectional or bidirectional. In an embodiment of the present invention, interconnects are point-to-point links and/or buses. Circuit components may likewise be connected in embodiments of the present invention.

Figure 3A:
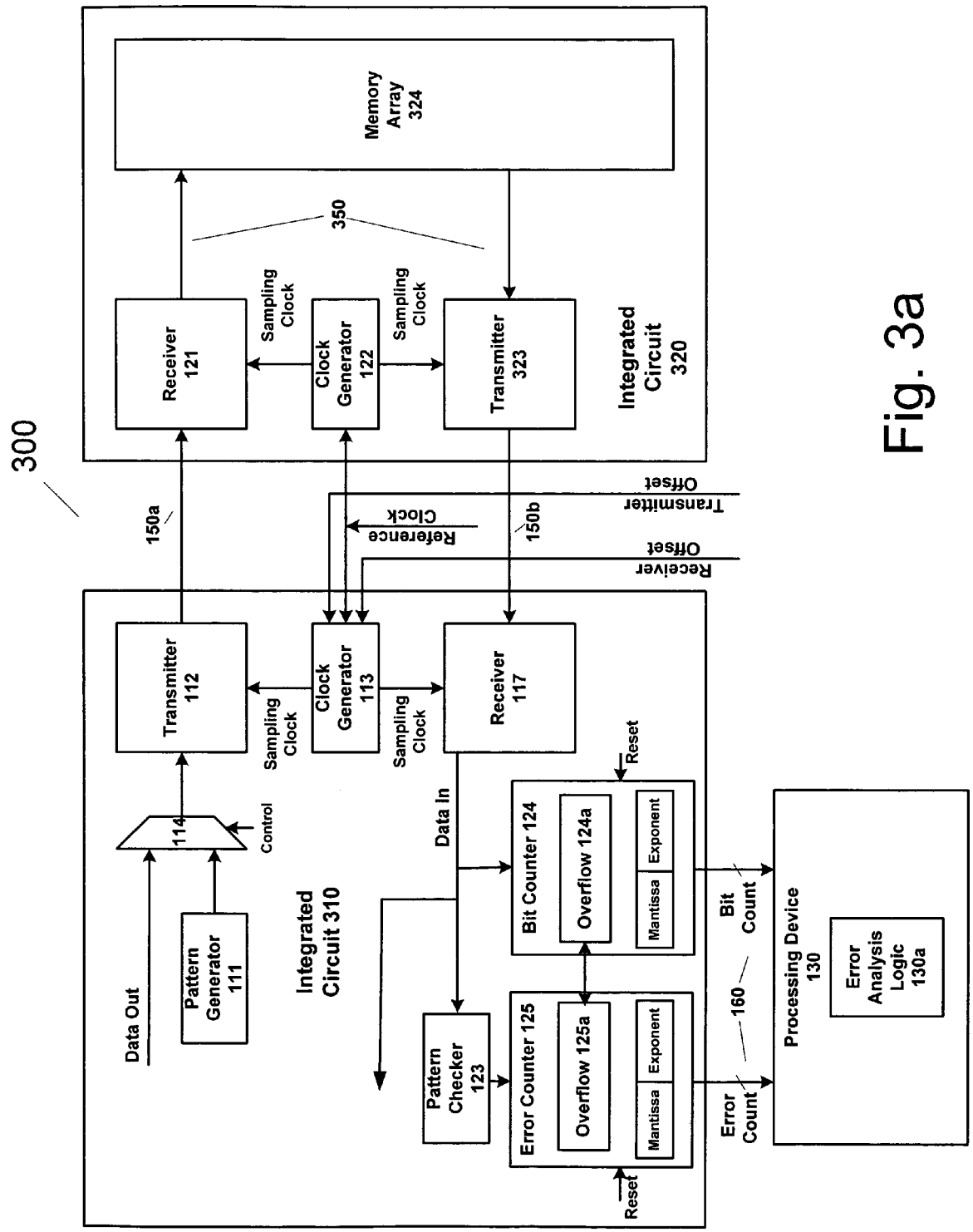
FIG. 3a illustrates an apparatus including a memory array according to an embodiment of the present invention.

In embodiments of the present invention, ICs described herein, include a master device, such as a memory controller, graphics controller or processor, or slave devices, such as memory device having a memory array. In an embodiment of the present invention, FIG. 3a illustrates an IC 310 that is a master device and IC 320 that is a memory device performing memory tasks. In another embodiment of the present invention, IC 110 is a processor and IC 120 is a processor that simulates an interface of a memory device that is not yet available on the market. In still a further embodiment of the present invention, ICs describe herein include limited features or functionality of a final manufactured monolithic IC discretely packaged device. ICs described herein are not specialized test ICs made from a different manufacturing process than a tested IC or have a generic interface to test multiple types of input/output ("I/O") interfaces of tested ICs.

ICs 110 and 120 are formed on a common substrate or die, such as a silicon wafer, or printed circuit board ("PCB") in embodiments of the present invention. In alternate embodiments of the present invention, ICs 110 and 120 are formed on different substrates or PCBs.

IC 110 includes pattern generator 111, multiplexer 114, transmitter 112 and clock generator 113. During a typical mode of operation, a data signal is input to multiplexer 114 that outputs the data signal to transmitter 112 responsive to a control signal input to multiplexer 114. Data is transmitted on interconnect 150 synchronously with respect to rising and falling edges of a sampling clock signal output from clock generator 113 in an embodiment of the present invention. A reference clock signal is input to clock generators 113 and 122 in embodiments of the present invention. In an embodiment of the present invention, an external reference clock generator provides a reference clock signal. In an embodiment of the present invention, a reference clock signal is generated from processing device 130.

Pattern generator 111 outputs a predetermined sequence of data values to multiplexer 114 during a test mode of operation. In a preferred embodiment of the present invention, pattern generator 111 generates a pseudo random bit sequence ("PRBS") that is also known by IC 120 (in particular pattern checker 123) that compares observed or received data values at receiver 121 to expected values in the PRBS known by pattern checker 123 to determine whether an error in a data bit occurred. In alternate embodiments of the invention, other pattern generators and/or checkers that are capable of detecting errors are used. The use of a pattern generator is preferred because a minimum amount of sampling components are used in receiver 121 and there is less likelihood of missing errors occurring at the center of a data eye as described below.

In an alternate embodiment of the present invention, rather than using pattern generator 111, multiplexer 114 and pattern checker 123, an error is output from receiver 121 to error counter 125. In this embodiment of the present invention, receiver 121 samples a data value at the approximate center of a data eye and an edge at an approximate edge of a data eye (also known as over-sampling) at the same approximate time and compares where an edge is located with respect to a data eye. In this embodiment of the present invention, additional sampling components are used in receiver 121, but errors at the center of the data eye or "an ideal" center sample may not be observed.

IC 120 includes receiver 121, clock generator 122, pattern checker 123, bit counter 124 and error counter 125. A data signal is received at receiver 121 from interconnect 150 synchronously with respect to rising and/or falling edges of a sampling clock signal output from clock generator 122. An offset signal is provided to clock generator 122 to adjust or offset a sampling clock signal input to receiver 121 in an embodiment of the present invention. In an embodiment of the present invention, an offset signal is generated from processing device 130. In an alternate embodiment of the present invention, an offset signal is generated internal to IC 120 responsive to a control signal.

Figure 4:
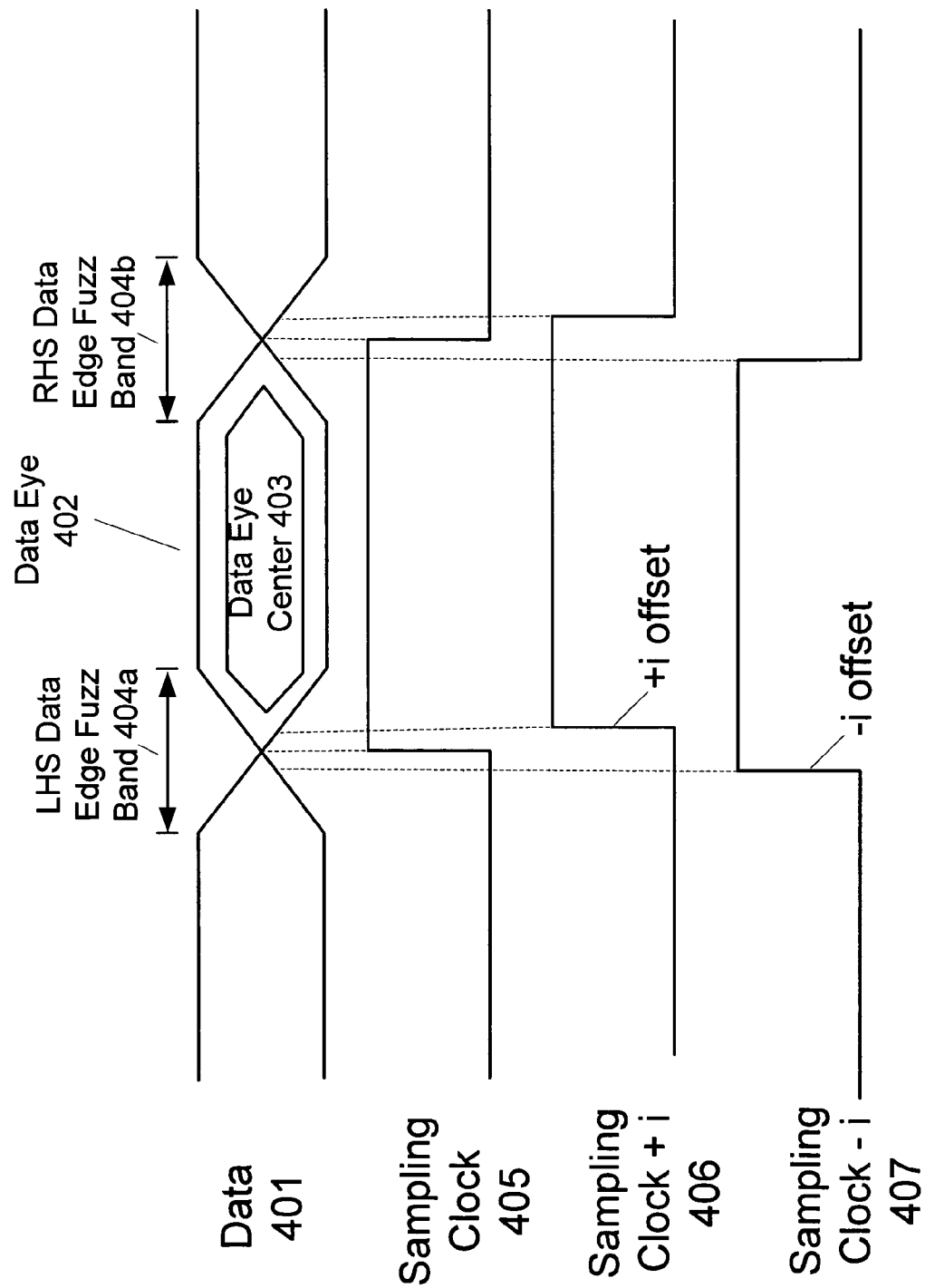
FIG. 4 illustrates adjusting or offsetting a sampling clock signal according to an embodiment of the present invention.

FIG. 4 illustrates adjusting a sampling clock signal by an offset signal (or receiver/transmitter offset signal) or increment/decrement (+i/−i) according to embodiments of the present invention. An increment or decrement signal representing a phase or timing offset of a sampling signal is provided to a clock generator to provide a plurality of sampling clock signals associated with the respective offsets in embodiments of the present invention. For example, FIG. 4 illustrates a sampling clock signal 405 having rising and falling edges approximately centered at LHS data edge fuzz band 404a and RHS data edge fuzz band 404b; while sampling clock signal 406 is incremented and sampling clock 407 is decremented with respect to sampling clock signal 405. In a preferred embodiment of the present invention, an increment/decrement or step size is $\frac{1}{256}$ of one clock cycle or one clock cycle of a reference clock signal. In an embodiment of the present invention, an offset-signal is an 8-bit digital word known as an offset word provided by processing device 130. Errors in the linearity of the offset step size are negligible in an embodiment of the present invention.

A data signal 401, as shown in FIG. 4, includes a data eye 402 having a data eye center 403. A data eye 402 is a portion or time period of a data signal 401 where a data value associated with the data signal 401 is observed or sampled. A data value may be associated with a voltage or current value in embodiments of the present invention. A data eye 402 has edges formed in LHS data edge fuzz band 404a and RHS data edge fuzz band 404b where a data signal may transition from one data value or logic state (i.e. logic 1) to another data value or logic state (i.e. logic 0).

Figure 5:
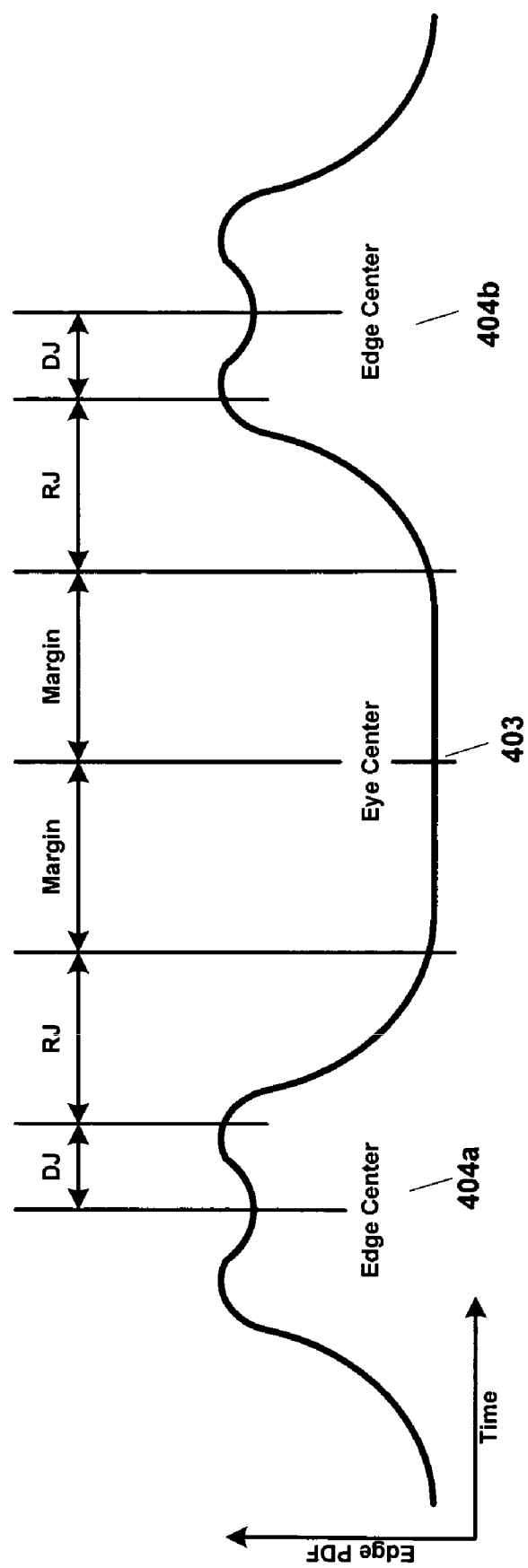
FIG. 5 illustrates a deterministic jitter ("DJ") component and a random jitter ("RJ") component according to an embodiment of the present invention.

FIG. 5 illustrates a DJ component and a RJ component corresponding to data signal 401 shown in FIG. 4 according to an embodiment of the present invention. The edge probability density function ("PDF") is plotted versus time in FIG. 5. The "PDF" describes the probability of an edge occurring at a particular offset in an embodiment of the invention. As illustrated, errors in data eye center 403 are much less likely than near the edge centers of LHS data edge fuzz band 404a and RHS data edge fuzz band 404b which include DJ and RJ components.

A data signal from receiver 121 is output to pattern checker 123 and bit counter 124. Pattern checker 123 outputs an error signal responsive to a data signal from receiver 121 to error counter 125 in an embodiment of the present invention. Pattern checker 123 compares an expected predetermined sequence of data values to received data values at receiver 121 and outputs an error signal to error counter 125 when a mismatch occurs.

IC 120 includes two counters: bit counter 124 and error counter 125 that keep track of a total number of data bits observed or measured and a corresponding total number of errors observed or measured during a period of time in an embodiment of the present invention. Both counters handle a large dynamic range of data and error values, while reducing the number of bits used to keep track of and output totals stored in the counters.

Bit counter 124 counts the number of data bits received by receiver 121 and outputs the total number of data bits received during a period of time to interconnect 160 in an embodiment of the present invention. Bit counter 124 includes overflow protection 124a for preventing overflow of the data count value of bit counter 124 in an embodiment of the present invention. Overflow protection 124a stops the incrementing of bit counter 124 if either bit counter 124 or error counter 125 reaches its maximum. Once the maximum of either bit counter is reached, both counters are held until software can retrieve the information or count value in an embodiment of the invention. Thus, bit counter 124 and error counter 125 will hold accurate information for a particular set of received data.

Bit counter 124 is a logarithmic bit counter including a mantissa and exponent in an embodiment of the present invention. A mantissa including an 8-bit word and an exponent including a 8-bit word is output as a 16-bit bus word on interconnect 160 responsive to a command by processing device 130 in an embodiment of the present invention. For example, a 16-bit bus word could have the first 8 bits for the mantissa, and the later 8 bits for the exponent. The mantissa is calculated by simply displaying the 8 most significant bits ("MSB") after a 0 to 1 transition. The exponent is calculated by counting the number of least significant bits ("LSB") until the MSB 0 to 1 transition, thereby displaying a 256-bit ($2^8$) counter to 8 significant digits.

Bit counter 124 is reset to a predetermined value, such as zero, responsive to reset signal in an embodiment of the present invention. A reset signal is generated internally to IC 120 responsive to a control signal or generated externally from processing device 130 in embodiments of the present invention.

Error counter 125 counts the number of errors in the data received by receiver 121 and outputs a total number of errors to interconnect 160 in an embodiment of the present invention.

Error counter 125 includes overflow protection 125a for preventing overflow of the error count value of error counter 125 in an embodiment of the present invention. Error counter 125 includes overflow protection 125a that operates similar to overflow protection 124a, described above, in an embodiment of the present invention.

Error counter 125 is a logarithmic bit counter including a mantissa and exponent in an embodiment of the present invention. Error counter 125 is a logarithmic bit counter that operates similar to bit counter 124, described above, in an embodiment of the present invention.

Bit counter 124 is reset to a predetermined value, such as zero, responsive to reset signal in an embodiment of the present invention. A reset signal is generated internally to IC 120 responsive to a control signal or generated externally from processing device 130 in embodiments of the present invention.

Processing device 130 is coupled to IC 120 by interconnect 160 in an embodiment of the present invention. Processing device 130 is a general-purpose computer including computer readable memory in an embodiment of the present invention. Error analysis logic 130a is software, or executable machine readable instructions, stored in non-volatile memory in processing device 130 in an embodiment of the present invention. In an embodiment of the present invention, error analysis logic 130a with processing device 130 performs some or all of the steps of methods 600 and 700, shown in FIGS. 6 and 7a–b, described below. In embodiments of the present invention, the functionality of processing device 130 is included in one or more ICs described herein.

Figure 2:
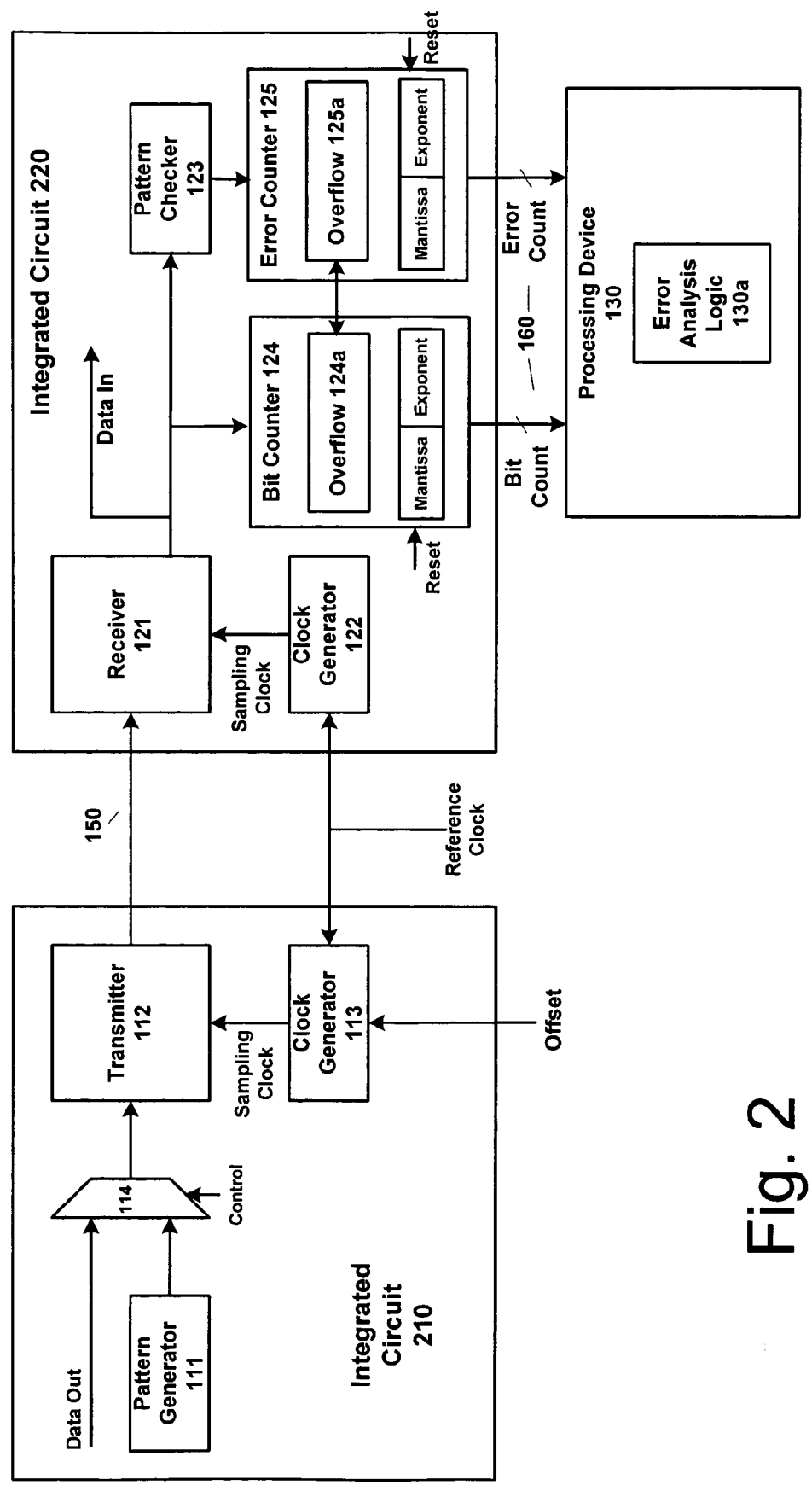
FIG. 2 illustrates an apparatus including offsetting a sampling clock signal in a transmitter according to an embodiment of the present invention.

FIG. 2 illustrates an apparatus 200 including offsetting a sampling clock signal in a transmitter according to an embodiment of the present invention. FIG. 2 illustrates similar components shown in FIG. 1, where like referenced components operate similarly as described above. Apparatus 200 includes ICs 210 and 220, similar to ICs 110 and 120 of apparatus 100 shown in FIG. 1. Apparatus 200, unlike apparatus 100, generates a sampling clock signal to transmitter 112 from clock generator 113 responsive to an offset signal.

FIG. 3a illustrates an apparatus 300 including a memory array 324 according to an embodiment of the present invention. FIG. 3a illustrates similar components shown in FIG. 1, where like referenced components operate similarly as described above. Unlike apparatus 100 shown in FIG. 1, apparatus 300 has a receiver and transmitter offset signal input to clock generator 113 to generate a plurality of sampling clock signals for transmitter 112 and receiver 117, respectively. In an embodiment, receiver 117 samples data signals in response to a receiver offset signal input in a first mode of operation and transmitter 112 generates data signals in response to a transmitter offset signal input in a second mode of operation. In embodiments of the present invention, receiver and transmitter offset signals are generated internally to IC 310 or externally by processing device 130. In an embodiment of the present invention, IC 320 is a memory device including memory array 324 and IC 310 is a master device.

A memory device is a common class of integrated circuit devices that have a plurality of storage cells, collectively referred to as a memory array 324. A memory device stores data (which may be retrieved) associated with a particular address provided, for example, as part of a write or read command from a master device.

Examples of types of memory devices include discretely packaged synchronous type dynamic random access memory ("DRAM") ICs, for example, double data rate SDRAM (DDR) memory devices, Direct Rambus® memory devices ("DRDRAM"), or "XDR™" memory devices, although the memory devices might be any of a number of other types, including but not limited to static random access memory ("SRAM"), Ferroelectric RAM ("FRAM"), Magnetoresistive ("MRAM") or Magnetic RAM, Flash, or read only memory ("ROM") singly or in combination.

In an embodiment of the present invention, IC 320 includes an input/output interface that includes request decode and array access logic (not shown) that, among other functions, decodes request and address information, and controls memory transfers between memory array 324 and routing path 350.

Receiver 121 is coupled to interconnect 150a, routing path 350 and clock generator 122. Transmitter 323 is coupled to clock generator 122, interconnect 150b and routing path 350 and transmits data signals from memory array 324 onto interconnect 150b.

Apparatus 300 operates similar to apparatus 100 described above. Apparatus 300 includes an IC 310 having pattern generator 111, multiplexer 114, transmitter 112 coupled to interconnect 150a and clock generator 113. In addition, IC 310 includes receiver 117 coupled to clock generator 113 and interconnect 150b for receiving data on interconnect 150b. Receiver 117 outputs data to pattern checker 123 coupled to error counter 125 having overflow protection 125a and bit counter 124 having overflow protection 124a. Processing device 130 including error analysis logic 130a is coupled to error counter 125 and bit counter 124 by interconnect 160.

Figure 3B:
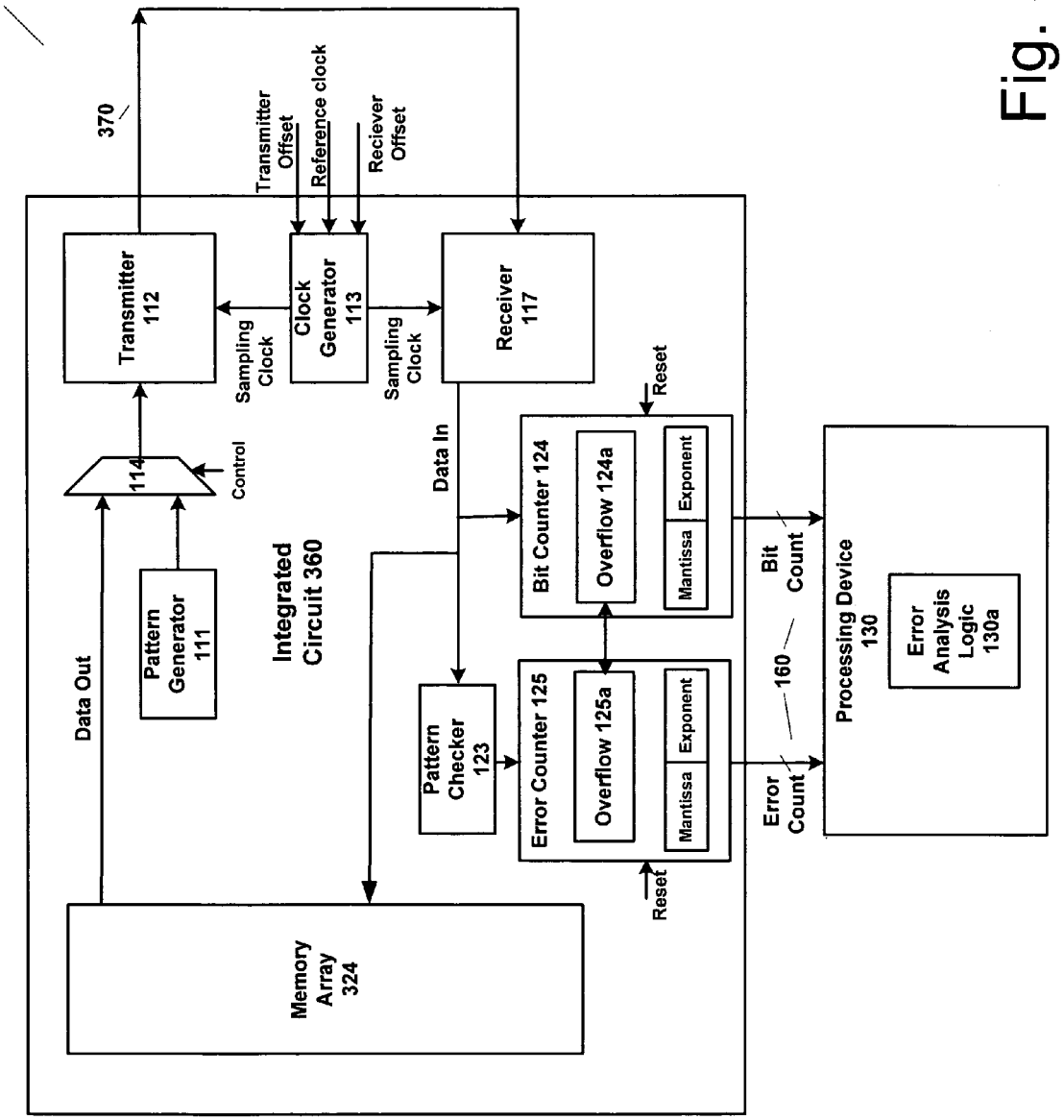
FIG. 3b illustrates an apparatus for self testing according to an embodiment of the present invention.

Apparatus 380 shown in FIG. 3b illustrates a self testing embodiment of the invention. Apparatus 380 includes an IC 360 having a memory array 324 that operates similarly to IC 310 shown in FIG. 3a. In an embodiment of the invention, IC 360 does not include a memory array 324. IC 360 is a memory device in an embodiment of the invention. IC 360 is self tested by using an interconnect 370 that is coupled to transmitter 112 and receiver 117. Interconnect 370 is an external set of wires for loop back testing in an embodiment of the present invention. Interconnect 370 is an internal (to IC 360) interconnect in another embodiment of the invention.

RJ and DJ components are measured by generating a plurality of offset signals from the approximate center of LHS data edge fuzz band 404a and RHS data edge fuzz band 404b to produce points or a plurality of BER values on a jitter cumulative distribution function ("CDF"). A "CDF" is the cumulative probability of a transition occurring at a particular offset. A "CDF" can be thought of as the integration of a "PDF" described above and is bounded from zero to one in an embodiment of the invention. The points on the Gaussian portion of the jitter CDF curve (below a threshold, i.e. $10^{-5}$) are transformed using the inverse of the standard normal cumulative distribution function ("SNCDF") shown in Equation 1. An inverse of the SNCDF, ("NormSInv") transform is calculated by numerical methods in an embodiment of the present invention. The "NormSInv" function is built into many software programs such as MathCad 11 for Windows, provided by Mathsoft™ Engineering & Education, Inc. Massachusetts, USA and Wolfram Mathmatica for Windows, provided by Wolfram Research, Inc. Champaign, Ill., USA, with slightly different names. However, an Excel 2000, provided by Microsoft® Corporation of Redmond, Wash., USA, function call "NormSInv" is utilized for the transform calculations in an embodiment of the invention.

Equation 1:

Standard normal (Gaussian) cumulative distribution function $$NORMSDIST(z) = \frac{1}{\sqrt{2\pi}} \int_z^\infty e^{\frac{-t^2}{2}} dt$$

Figure 8:
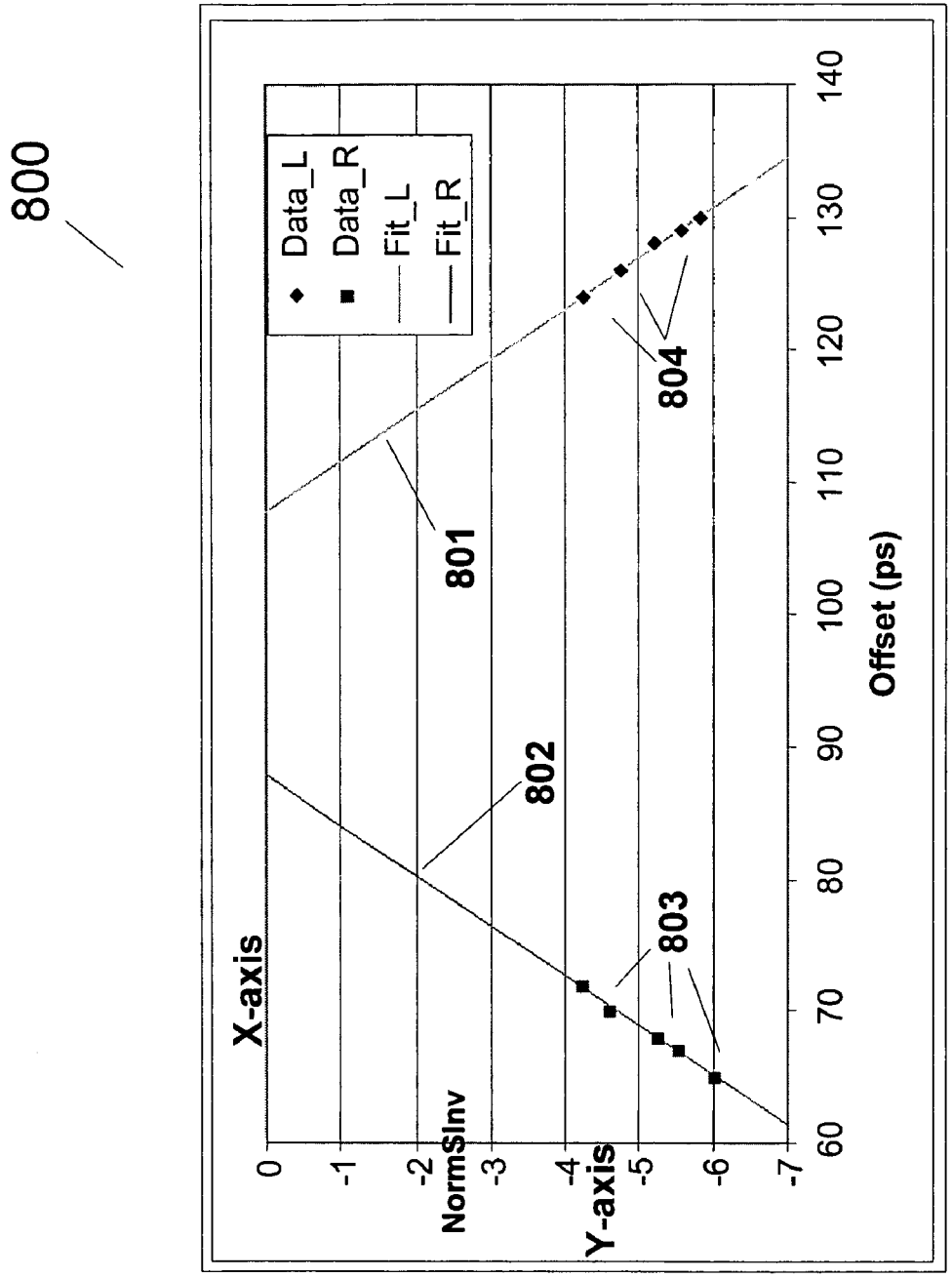
FIG. 8 illustrates a linear relationship between a plurality of transformed error values and a plurality of sampling clock signals according to an embodiment of the present invention.

The plurality of transformed BER values 803 and 804 or NormSInv values (Y-axis) are plotted verses the corresponding plurality of offsets (X-axis), as shown in chart 800 of FIG. 8, to produce a liner relationship. A linear fit is then applied to BER values 803 and 804 to provide lines 802 and 801, respectively. The x-intercept of lines 801 and 802 correspond to the mean of the Gaussian portion of the jitter CDF curve (DJ component), and the slope of lines 801 and 802 corresponds to the standard deviation of the Gaussian portion of the jitter CDF curve (RJ component). In particular a difference between the x-intercept of right line 801 and the x-intercept of left line 802 correspond to a DJ component.

In an embodiment of the present invention, a minimum of three BER values are used to form two lines (two BER values for a first line and one BER value to locate the second line which has a slope equal to −1 time the slope of the first line) in obtaining DJ and RJ components. In a preferred embodiment of the present invention, a first plurality of BER values are used to form a first line and a second different plurality of BER values are used to form a second line.

The measured RJ and DJ components of the BER are then input into a Fibre Channel jitter model equation shown in equation 2 in order to calculate and predict BER. The Fibre Channel jitter model equation is a simplified model equation containing two equal height DJ impulses combined with Gaussian RJ.

Equation 2: Fibre Channel jitter model equation $$BER(t) = \frac{TD}{2} \cdot \left[ 2 - NORMSDIST\left(\frac{t - DJ/2}{RJ}\right) - NORMSDIST\left(\frac{t + DJ/2}{RJ}\right) \right]$$

TD is the transition density of the transferred data pattern where a value of 0.5 is used for a PRBS pattern in an embodiment of the present invention. The function NORMSDIST is defined in Equation 1 above. Parameter t is an offset value from the approximate center of a LHS data edge fuzz band 404a and a RHS data edge fuzz band 404b as seen in FIG. 4.

Table 1 below illustrates starting (or observed/calculated) and transformed data stored in processing device 130 in order to obtain RJ and DJ jitter components in embodiments of the present invention. Table 1 also illustrates chart data used to compare to numbers (or to lines 901 and 902 shown in plot 900 of FIG. 9) calculated by the Fibre Channel jitter model in Equation 2.

A first column of Table 1 represents a plurality of offset values in terms of a fraction of the unit interval ("UI") for a sampling clock signal corresponding to a respective plurality of calculated BERs. Both the left-hand side ("LHS") corresponding to negative offsets and right-hand side ("RHS") corresponding to positive offsets relative to an approximate center of a data eye is measured.

A second column represents corresponding offset values that have been converted into time (ps) or delay, relative to an approximate center of a data edge fuzz band.

A third column represents a plurality of BERs for corresponding offset values. In an embodiment of the present invention, the plurality of BERs in the third column are calculated by dividing a total error count number output from error counter 125 by a total number of bits received output from bit counter 124.

A fourth column represents a corresponding plurality of transformed BER values by using a NormSInv transform described above.

A fifth column represents shifted time delays so the worst case BER value is centered at time 0 by using the average of the two x-intercepts shown in Table 2 that is described below.

A sixth column represents the logarithm of the observed BER (shown as data points 903 and 904 in FIG. 9) in order to compare it with lines 901 and 902 resulting from calculating the Fibre Channel jitter model equation with the measured RJ and DJ components. This mapping provides a means to extrapolate to low BER that would otherwise take an unreasonable amount of time to test in real time (i.e. one error every year). Additionally, the logarithm function can be used to generate a graphical representation of the BER variation with clock offset, commonly known as a "bathtub curve".

TABLE 1

Obtained data and calculation

| Starting Data | | | Transform | Chart Data | |
| --- | --- | --- | --- | --- | --- |
| LHS (UI) | Delay_L | BER_L | NormSInv | New Time | Log BER |
| −0.38 | 124 | 2.50E−06 | −4.26504 | 26 | −5.60206 |
| −0.37 | 126 | 2.30E−07 | −4.7705 | 28 | −6.63827 |
| −0.36 | 128 | 2.20E−08 | −5.22341 | 30 | −7.65758 |

TABLE 1-continued

Obtained data and calculation

| -0.355 | 129 | 3.00E-09 | -5.58083 | 31 | -8.52288 |
| -0.35  | 130 | 6.30E-10 | -5.84638 | 32 | -9.20066 |

| Starting Data | | | Transform | Chart Data | |
| --- | --- | --- | --- | --- | --- |
| RHS (UI) | Delay_R | BER_R | NormSInv | New Time | Log BER |
| 0.36  | 72 | 2.70E-06 | -4.24783 | -26 | -5.56867 |
| 0.35  | 70 | 4.50E-07 | -4.63346 | -28 | -6.34679 |
| 0.34  | 68 | 1.80E-08 | -5.26044 | -30 | -7.74473 |
| 0.335 | 67 | 3.30E-09 | -5.56423 | -31 | -8.48149 |
| 0.325 | 65 | 2.00E-10 | -6.03454 | -33 | -9.69897 |

The plurality of offset delays (column 2) and NormSInv transform values (column 4) from Table 1 are then fit to a straight line, as shown in FIG. 8, using a linear fit function that outputs the values shown in Table 2 below. In an embodiment of the present invention, an Excel 2000 linear fit function is used.

TABLE 2

Linear fit parameters from NormSInv transform

| Fit | m | b | Sigma | Mu |
| --- | --- | --- | --- | --- |
| LHS | -0.26225 | 28.27298 | 3.813205 | 107.8107 |
| RHS | 0.263898 | -23.1988 | 3.789336 | 87.90787 |

A second column of Table 2 represents data that fits the slope of the BER data as represented by right line 801 and left line 802 seen in FIG. 8. In an embodiment of the present invention, right line 801 corresponds to the transition between the LHS data edge fuzz band and the data eye center while left line 802 corresponds to the transition between the RHS data edge fuzz band and the data eye center.

A third column of Table 2 represents data that fit the x-intercept of the inputted data as represented by right line 801 and left line 802 seen in FIG. 8.

A fourth column of Table 2 represents Sigma, or standard deviation, of the Gaussian RJ that is the inverse of the magnitude of the slope of the respective fit lines 801 and 802.

A fifth column of Table 2 represents the Mu, or average, of the jitter distribution that is the x-intercept of the respective fit lines 801 and 802.

Sigma and Mu of the two lines 802 and 801 are then converted to RJ and DJ jitter components, as seen in Table 3, and used in a Fibre Channel jitter model equation. A RJ component of Table 3 is calculated by averaging the two standard deviation coefficients, Sigma, from Table 2. A DJ component of Table 3 is calculated by the difference between the two x-intercepts, Mu, from Table 2 (center of DJ impulses).

TABLE 3

RJ and DJ parameters for Fibre Channel jitter model equation

| RJ | DJ |
| --- | --- |
| 3.801270665 | 19.90280307 |

Figure 9:
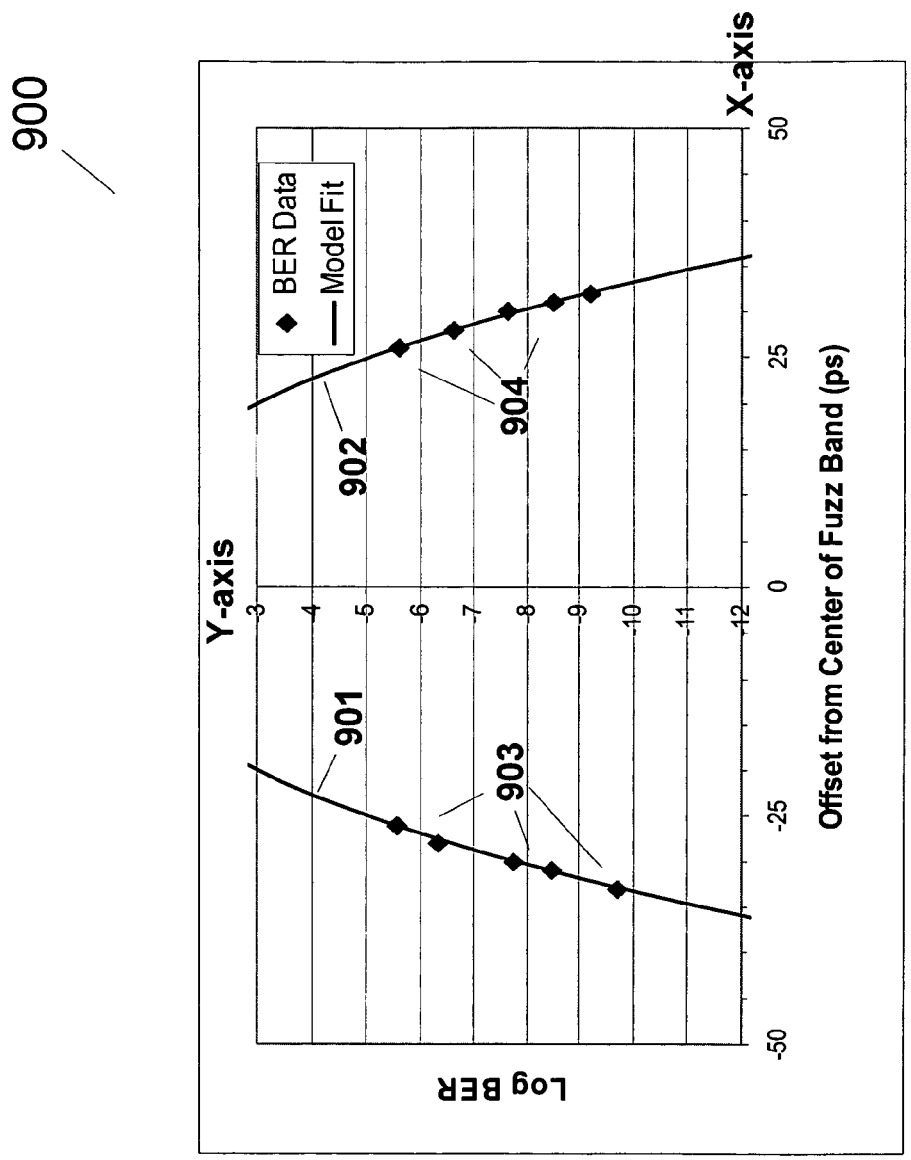
FIG. 9 illustrates a Fibre Channel jitter model fit according to an embodiment of the present invention.

FIG. 9 illustrates a BER Fibre Channel jitter model fit, lines 901 and lines 902, using RJ and DJ of Table 3 according to an embodiment of the present invention. Lines 901 and 902, representing a Fibre Channel jitter model of equation 2, that provides an accurate prediction for BER as compared to measured data 903 and 904 from the last two columns of Table 1.

Figure 6:
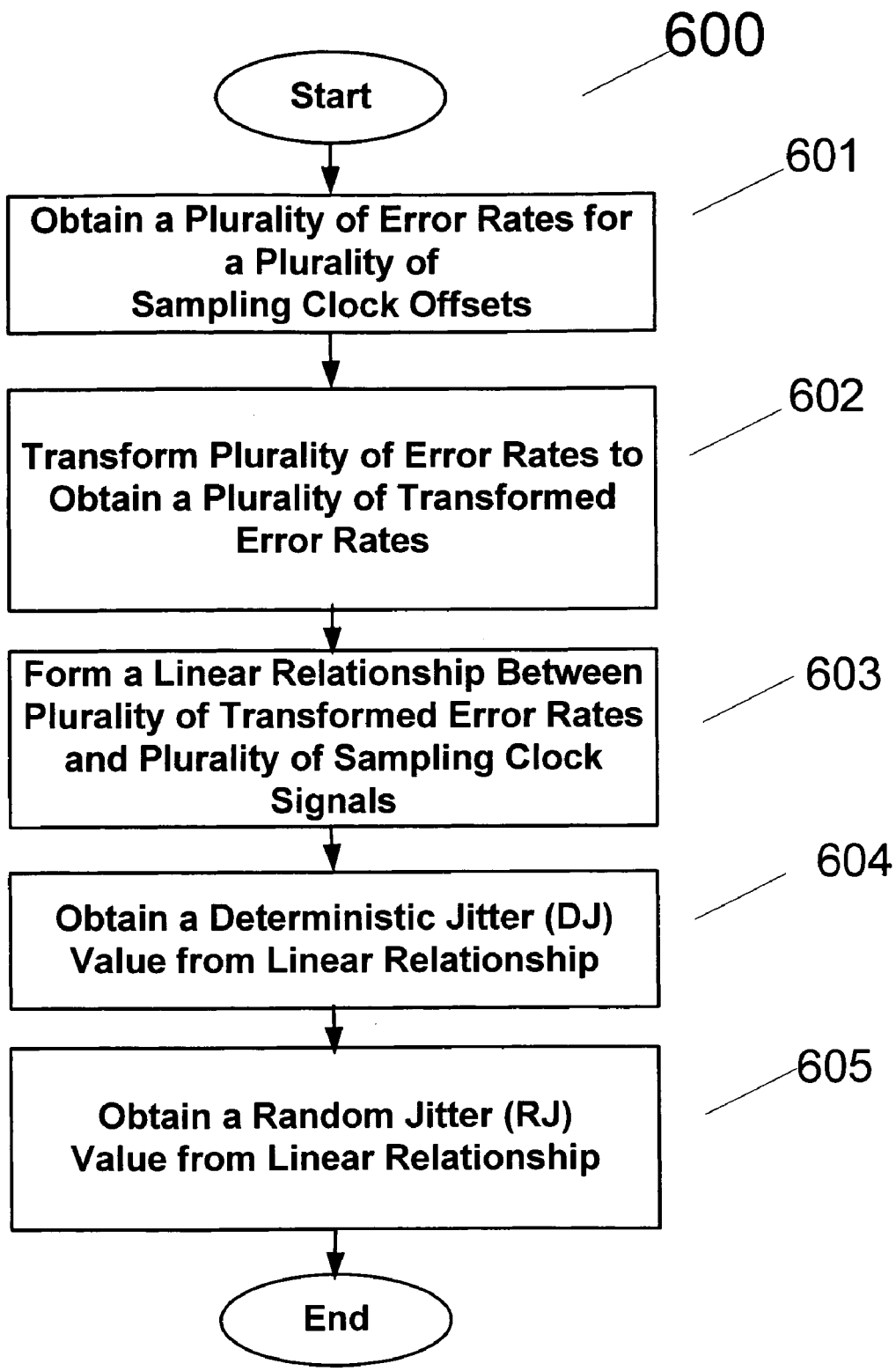
FIG. 6 illustrates a method according to an embodiment of the present invention.
Figure 7A:
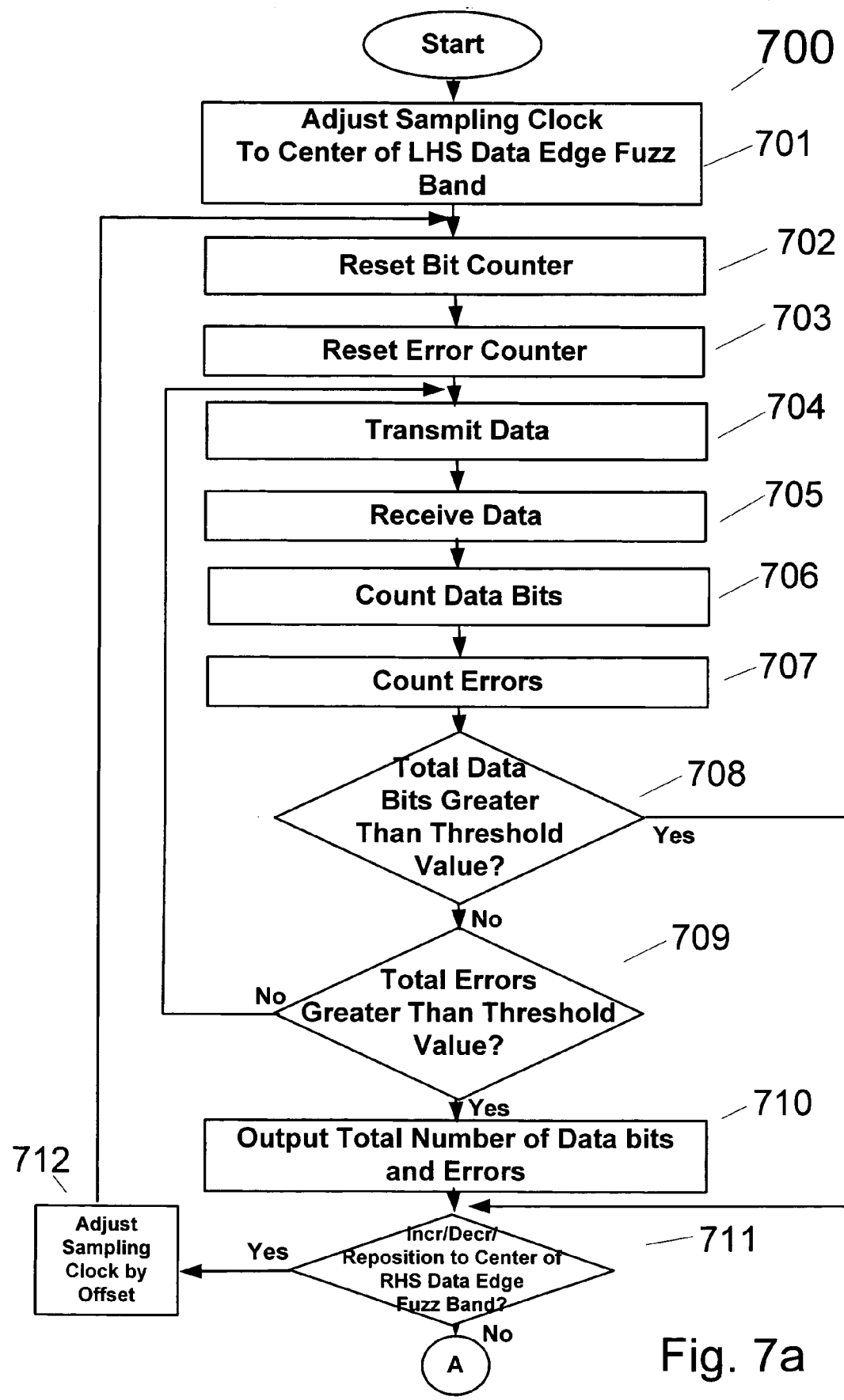
FIGS. 7a–b illustrate a method according to an embodiment of the present invention.
Figure 7B:
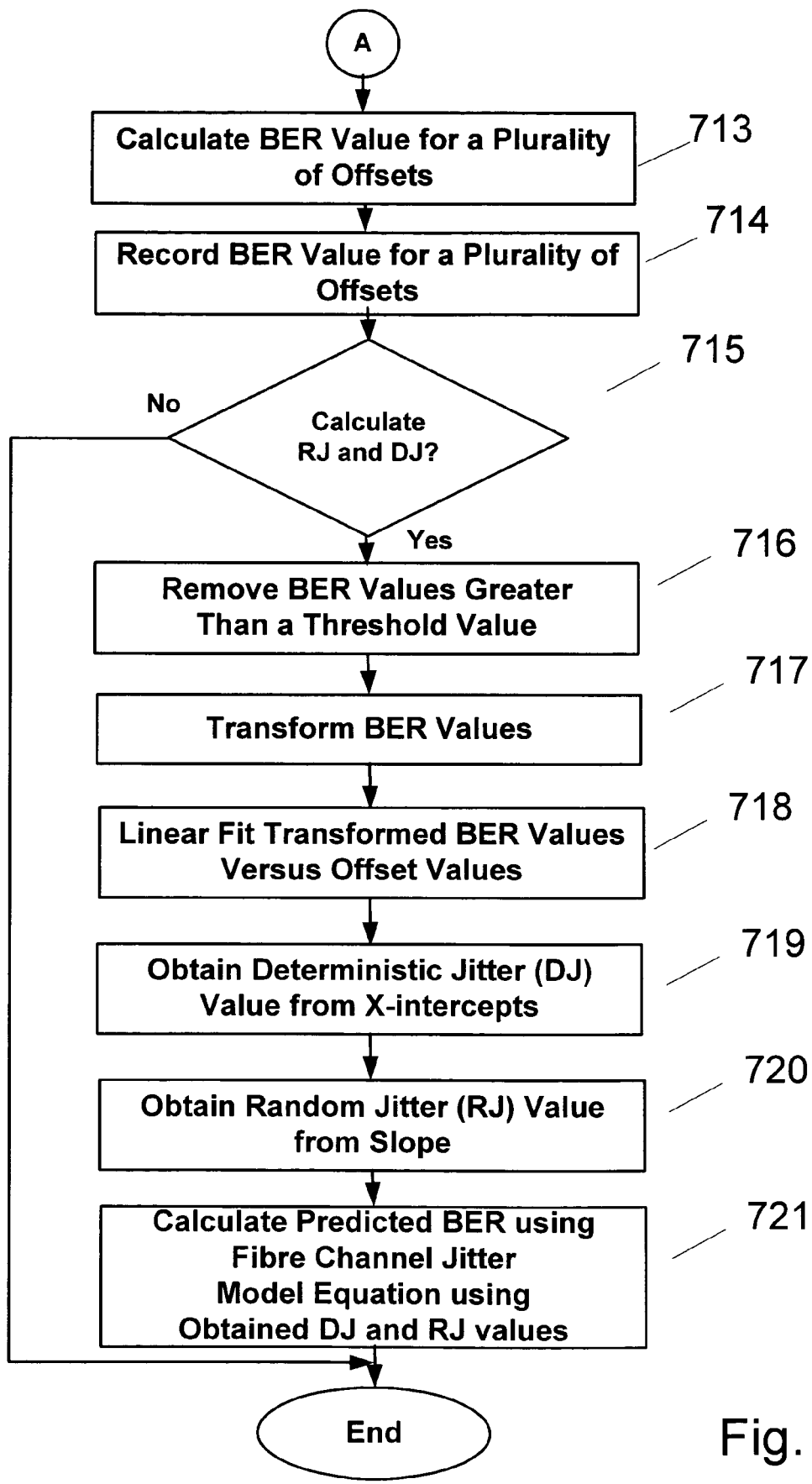

FIGS. 6 and 7a–b illustrate methods 600 and 700, respectively, according to embodiments of the present invention. In alternate embodiments of the present invention, the steps or logic illustrated in FIGS. 6 and 7a–b are carried out by hardware, software (i.e. executable machine readable instructions), a user or a combination thereof. In alternate embodiments of the present invention, the steps illustrated in FIGS. 6 and 7a–b are carried out by the components illustrated in FIGS. 1, 2 and 3. As one of ordinary skill in the art would appreciate, other steps that are not shown may be included or shown steps may be excluded in various embodiments of the present invention.

Method 600 begins at step 601 where a plurality of error rates corresponding to a plurality of sampling clock signals, in particular a plurality of respective offsets of a sampling clock, is obtained. In an embodiment of the present invention, the plurality of error rates are obtained as described below, and in particular, using steps 701–713 shown in FIGS. 7a–b. In an embodiment of the present invention, the plurality of error rates is a plurality of BERs.

The plurality of error rates are respectively transformed to obtain a plurality of transformed error rates in step 602. In an embodiment of the present invention, a NormSInv transform function is used to transform respective error rates.

A linear relationship between the plurality of transformed error rates and the plurality of sampling clock signals is formed in step 603. In an embodiment of the present invention, the linear relationship is formed by creating a linear fit with transformed error rate values and sampling clock signals (or sampling clock signal offset values) as illustrated by FIG. 8.

DJ and RJ values are obtained in steps 604 and 605, respectively. A DJ value is obtained by determining the difference between x-axis intercepts of two lines formed by a linear fit of the transformed error rate values and sampling clock offset values in an embodiment of the present invention. An RJ value is obtained by determining the magnitudes of slopes of the lines formed by a linear fit of the transformed error rate values and sampling clock offset values in an embodiment of the present invention.

Method 600 then ends.

In a further embodiment of the present invention, DJ and RJ values are used in a BER Fibre Channel jitter model equation, as described above, to predict BER at any particular offset value.

In an embodiment of the present invention, method 600 is performed by error analysis logic 130a in processing device 130. In an embodiment of the present invention, method 600 is performed by software executed by a general purpose computer. In an embodiment of the present invention, steps illustrated in FIG. 6 represent software components stored on an article of manufacture, such as a computer readable medium. For example, the software is stored in a magnetic hard disk, an optical disk, a floppy disk, compact disk read-only memory ("CD-ROM"), random access memory ("RAM"), read-only memory ("ROM"), or other readable or writeable data storage technologies, singly or in combination in embodiments of the present invention. In embodiments of the present invention, a software component is a software program, a software object, a software function, a software subroutine, a software method, a software instance, and a code fragment, singly or in combination.

FIGS. 7a–b illustrate method 700 according to an embodiment of the present invention. Method 700 begins at step 701 where a sampling clock signal is adjusted to an approximate center of a LHS data edge fuzz band. In an embodiment of the present invention, sampling clock signal 405 is positioned at the approximate center of LHS data edge fuzz band 404a or at the left of data eye center 403 as illustrated in FIG. 4.

In an alternate embodiment, a sampling clock signal is first adjusted to an approximate center of a RHS data edge fuzz band, rather than a LHS data edge fuzz band, in step 701 and then repositioned to an approximate center of a LHS data edge fuzz band in step 711.

A bit counter and error counter is then reset to a predetermined value, such as zero, as illustrated by steps 702 and 703, respectively. In an embodiment of the present invention, bit counter 124 and error counter 125, as illustrated in FIGS. 1, 2 and 3, are set to zero in embodiments of the present invention.

Data is then transmitted and received as illustrated by steps 704 and 705, respectively. In embodiments of the present invention, data is transmitted by transmitter 112, by way of interconnect 150, and received by receiver 121 as illustrated in FIGS. 1, 2 and 3.

Data bits and bit errors are counted as illustrated by steps 706 and 707, respectively. In an embodiment of the present invention, bit counter 124 and error counter 125 count data bits and bit errors.

A determination is made whether the total number of data bits received is greater than a data bit threshold value as illustrated in step 708. If the data bit threshold value is met or exceeded, control transfers to step 711; otherwise control transfers to step 709. In an embodiment of the present invention, if a threshold value is met or exceeded in step 708, a loop formed by steps 704–709 is broken or timeouts so there is no longer a waiting for a threshold value of errors.

A determination is made whether the total number of errors is greater than an error threshold value as illustrated in step 709. If the error threshold value is met or exceeded, control transfers to step 710; otherwise, control transfers back to step 704 and steps 704–708 are repeated. In an embodiment of the present invention, data bit and error threshold values are stored in bit counter 124 and error counter 125, respectfully, in embodiments of the present invention. In an embodiment of the present invention, data bit and error threshold values are provided by processing device 130.

A total number of data bits received and corresponding total number of errors is then output as illustrated by step 710. In embodiments of the present invention, a total number of data bits received and corresponding total number of errors is output on interconnect 160 to processing device 130 as shown in FIGS. 1, 2 and 3.

A determination is made whether to increment, decrement or reposition a sampling clock signal to an approximate center of RHS data edge fuzz band 404b shown in FIG. 4. If a sampling clock signal will be adjusted, control transfers to step 712 that illustrates adjusting a sampling clock signal and steps 702–710 are then repeated; otherwise control transfers to step 713. In an embodiment of the present invention, a sampling clock signal is incremented or decremented as illustrated by FIG. 4.

A BER value is then calculated for a corresponding sampling clock signal or offset value of such as illustrated by step 713. In an embodiment of the present invention, a BER value is calculated by dividing the total number of errors output from error counter 125 by the total number of data bits received output from bit counter 124. In an embodiment of the present invention, processing device 130 calculates the BER value.

A BER value corresponding to each sampling clock signal offset value is then recorded as illustrated by step 714 in an embodiment of the invention. In an embodiment of the present invention, a BER value corresponding to a sampling clock signal offset value is stored in memory of processing device 130. In an embodiment of the present invention, a plurality of BER values having corresponding sampling clock signal offset values is recorded.

A determination is made whether to calculate RJ and DJ as illustrated by step 715. In embodiments of the present invention, a user or processing device 130 makes the determination.

The plurality of recorded BER values having respective offset values are truncated or removed based on a truncate threshold value as illustrated by step 716. In an embodiment of the present invention, BER values greater than a threshold value of $10^{-5}$ are not used to calculate RJ and DJ values.

The remaining BER values are transformed as illustrated by step 717. In an embodiment of the present invention, a NormSlnv function as described above is used on each of the plurality of BER values that was not truncated.

A linear fit of transformed BER values and respective offset values is then created as illustrated by step 718. In an embodiment of the present invention, a linear fit of transformed BER values and respective offset values is created as illustrated by lines 801 and 802 in FIG. 8.

A DJ value is then obtained in step 719. In an embodiment of the present invention, a DJ value is obtained from the difference between the intercepts of the x-axis of the two lines formed in step 718.

A RJ value is then obtained in step 720. In an embodiment of the present invention, a RJ value is obtained from a magnitude of a slope of a line formed in step 718.

A predicted BER is calculated using a Fibre Channel jitter model equation including the obtained DJ and RJ values in step 721. In an embodiment of the present invention, processing device 130 calculates the predicted BER.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method, comprising:
    obtaining a plurality of error rates corresponding to a plurality of sampling clock offset values;
    transforming the plurality of error rates to obtain a plurality of transformed error rates;
    forming a linear relationship between the plurality of transformed error rates and the plurality of sampling clock offset values;
    obtaining a deterministic jitter value from the linear relationship; and
    obtaining a random jitter value from the linear relationship.

2. The method of claim 1, further comprising:
transmitting, by a transmitter, a predetermined sequence of data values.

3. The method of claim 2, further comprising receiving a plurality of data values, wherein a receiver samples the plurality of data values with the plurality of sampling clock offset values.

4. The method of claim 1, wherein a master device performs the obtaining and transforming.

5. The method of claim 1, further comprising counting a number of data values by a logarithmic counter.

6. The method of claim 1, further comprising counting a number of data values by an overflow protected counter.

7. The method of claim 1, further comprising:
counting a number of errors by comparing a plurality of expected data values to a plurality of measured data values.

8. The method of claim 1, further comprising:
counting a number of errors by oversampling a plurality of data values.

9. The method of claim 1, wherein the transforming includes performing an inverse standard normal cumulative distribution function.

10. The method of claim 1, wherein the forming includes performing a linear fit on the plurality of transformed error rates and the plurality of sampling clock offset values.

11. The method of claim 10, wherein the plurality of transformed error rates are plotted versus the plurality of sampling clock offset values.

12. The method of claim 1, wherein the obtaining the deterministic jitter value is obtained from a difference between a first x-intercept of a first line and a second x-intercept of a second line formed by plotting the plurality of transformed error rates versus the plurality of sampling clock offset values.

13. The method of claim 1, further comprising:
using the deterministic jitter value and random jitter value in a Fibre Channel jitter model equation.

14. The method of claim 1, wherein a memory device and a master device performs the method.

15. A method, comprising:
adjusting a sampling signal by a first plurality of offset values;
counting a plurality of data values to obtain a total number of data values for respective offset values in the first plurality of offset values;
counting a number of errors in the plurality of data values for respective offset values in the first plurality of offset values;
calculating a first plurality of error rates in response to the total number of data values in the plurality of data values and the number of errors in the plurality of data values for respective offset values in the first plurality of offset values;
adjusting the sampling signal by a second plurality of offset values;
counting a plurality of data values to obtain a total number of data values for respective offset values in the second plurality of offset values;
counting a number of errors in the plurality of data values for respective offset values in the second plurality of offset values;
calculating a second plurality of error rates in response to the total number of data values in the plurality of data values and the number of errors in the plurality of data values for respective offset values in the second plurality of offset values;
transforming the first and second plurality of error rates to obtain a first and second plurality of transformed error rates;
forming a first and second linear relationship between the first and second plurality of transformed error rates and the first and second plurality of offset values, respectively;
obtaining a deterministic jitter value from the first and second linear relationship; and
obtaining a random jitter value from the first and second linear relationship.

16. The method of claim 15, further comprising:
transmitting a predetermined sequence of data values.

17. The method of claim 15, wherein a transmitter performs the adjusting.

18. The method of claim 15, wherein a receiver performs the adjusting.

19. The method of claim 15, wherein a logarithmic counter performs the counting.

20. The method of claim 15, wherein a counter having overflow protection performs the counting.

21. The method of claim 15, wherein the counting the number of errors includes comparing expected data values to measured data values.

22. The method of claim 15, wherein the counting the number of errors includes oversampling a data value in the plurality of data values.

23. The method of claim 15, wherein the transforming includes performing an inverse standard normal cumulative distribution function.

24. The method of claim 15, wherein the forming includes performing a first and second linear fit on the first and second plurality of transformed error rates and the first and second plurality of offset values.

25. The method of claim 24, wherein the first and second plurality of transformed error rates are plotted versus the first and second plurality of offset values.

26. The method of claim 15, wherein the obtaining the deterministic jitter value is obtained from a difference between a first x-intercept of a first line and a second x-intercept of a second line formed by plotting the first and second plurality of transformed error rates versus the first and second plurality of offset values, respectively.

27. The method of claim 15, wherein the obtaining the random jitter value is obtained from an inverse of a magnitude of a slope of a line formed by plotting the first plurality of transformed error rates versus the first plurality of offset values.

28. The method of claim 15, further comprising:
using the deterministic jitter value and random jitter value in a Fibre Channel jitter model equation.

29. The method of claim 15, wherein a memory device and a master device performs the method.

30. An apparatus, comprising:
a receiver to sample a plurality of data values in response to a plurality of sampling clock offset values; wherein the receiver includes:
a first counter to indicate a number of data values received by the receiver,
a second counter to indicate a number of errors in the number of data values, and
a processing device, coupled to the receiver; wherein the processing device:
obtains a plurality of error rates corresponding to the plurality of sampling clock offset values, wherein a first error rate in the plurality of error rates is calculated in response to the number of data values and the number of errors, transforms the plurality of error rates to obtain a plurality of transformed error rates, forms a linear relationship between the plurality of transformed error rates and the plurality of sampling clock offset values, obtains a deterministic jitter value from the linear relationship, and obtains a random jitter value from the linear relationship.

31. The apparatus of claim 30, further comprising a transmitter to transmit a predetermined sequence of data values.

32. The apparatus of claim 30, wherein the first counter is a logarithmic counter.

33. The apparatus of claim 30, wherein the first counter is an overflow protected counter.

34. The apparatus of claim 30, wherein the receiver includes:
a pattern checker to compare the plurality of received data values to a plurality of expected data values.

35. The apparatus of claim 30, wherein the receiver includes:
a sampler to oversample the plurality of data values.

36. The apparatus of claim 30, wherein the transforms includes a calculation of inverse standard normal cumulative distribution function.

37. The apparatus of claim 30, wherein the forms includes a linear fit on the plurality of transformed error rates and the plurality of sampling clock offset values.

38. The apparatus of claim 37, wherein the plurality of transformed error rates are plotted versus the plurality of sampling clock offset values.

39. The apparatus of claim 30, wherein the deterministic jitter value is obtained from a difference between a first x-intercept of a first line and a second x-intercept of a second line formed by plotting the plurality of transformed error rates versus the plurality of sampling clock offset values.

40. The apparatus of claim 30, wherein the random jitter value is obtained from an inverse of a magnitude of a slope of a line formed by plotting the plurality of transformed error rates versus the plurality sampling clock offset values.

41. The apparatus of claim 30, wherein the deterministic jitter value and random jitter value is used in a Fibre Channel jitter model equation.

42. An apparatus, comprising:
an integrated circuit that operates in a first and second mode of operation,
wherein the first mode of operation a receiver samples a plurality of data values in response to a first plurality of sampling clock offset values,
wherein the second mode of operation a transmitter generates a plurality of data values in response to a second plurality of sampling clock offset values,
a first counter to indicate a number of data values received by the receiver,
a second counter to indicate a number of errors in the number of data values, and
a processing device, coupled to the integrated circuit; wherein the processing device:
obtains a plurality of error rates corresponding to either the first or second plurality of sampling clock offset values, wherein a first error rate in the plurality of error rates is calculated in response to the number of data values and the number of errors,
transforms the plurality of error rates to obtain a plurality of transformed error rates,
forms a linear relationship between the plurality of transformed error rates and either the first or second plurality of sampling clock offset values,
obtains a deterministic jitter value from the linear relationship, and
obtains a random jitter value from the linear relationship.

43. An apparatus, comprising:
an integrated circuit memory device including,
a transmitter to generate a plurality of data values,
a receiver to receive the plurality of data values,
a first counter to indicate a number of data values received by the receiver,
a second counter to indicate a number of errors in the number of data values, and
a processing device, coupled to the integrated circuit memory device; wherein the processing device:
obtains a plurality of error rates corresponding to a plurality of sampling clock offset values, wherein a first error rate in the plurality of error rates is calculated in response to the number of data values and the number of errors,
transforms the plurality of error rates to obtain a plurality of transformed error rates,
forms a linear relationship between the plurality of transformed error rates and the plurality of sampling clock offset values,
obtains a deterministic jitter value from the linear relationship, and
obtains a random jitter value from the linear relationship.

44. An apparatus, comprising:
a receiver to receive a plurality of data values in response to a sample clock signal; and,
means, coupled to the receiver, for providing a deterministic jitter value and a random jitter value based on a linear relationship between a plurality of bit error rates and corresponding sample clock offset values.

45. An apparatus, comprising:
a receiver capable to receive a plurality of data values in response to a sample clock signal; and,
means, coupled to the receiver, for calculating a plurality of bit error rate values corresponding to a plurality of sample clock offset in either the transmitter or receiver, or both.

* * * * *